PATENT

United States Patent [19]
Wu

[11] Patent Number: 5,644,258
[45] Date of Patent: Jul. 1, 1997

[54] DRIVER CIRCUIT, WITH LOW IDLE POWER CONSUMPTION, FOR AN ATTACHMENT UNIT INTERFACE

[75] Inventor: Chung-Hsia Wu, Hsinchu, Taiwan

[73] Assignee: Winbond Electronics Corp., Hsinchu, Taiwan

[21] Appl. No.: 582,951

[22] Filed: Jan. 4, 1996

[51] Int. Cl.$^6$ ............................................. H03K 19/0175
[52] U.S. Cl. ........................... 327/110; 327/65; 327/52; 326/86
[58] Field of Search .................................. 327/563, 110, 327/108, 65, 52, 51, 544; 326/86, 83, 82

[56] References Cited

U.S. PATENT DOCUMENTS

| | | | |
|---|---|---|---|
| 4,999,519 | 3/1991 | Kitsukawa et al. | 327/544 |
| 5,177,378 | 1/1993 | Nagasawa | 326/83 |
| 5,309,036 | 5/1994 | Yang et al. | 327/110 |
| 5,386,207 | 1/1995 | Lin | 327/65 |
| 5,406,133 | 4/1995 | Vora et al. | 327/108 |
| 5,438,545 | 8/1995 | Sim | 326/83 |
| 5,488,322 | 1/1996 | Kaplinsky | 327/108 |
| 5,568,436 | 10/1996 | Penchuk | 327/52 |

*Primary Examiner*—Timothy P. Callahan
*Assistant Examiner*—Terry L. Englund
*Attorney, Agent, or Firm*—Fish & Richardson P.C.

[57] ABSTRACT

A driver circuit, for an attachment unit interface in a network, includes a constant current source, a pair of logic gates, a differential transistor pair, a pair of load resistors, at least a first pair of switch transistors, a pair of source followers and another switch transistor. The source followers receive the differential voltage outputs from the drain terminals of the differential transistors. The bias current which operates the differential transistor pair is saved during Idle of the circuit by a de-assertion state of an enable signal.

4 Claims, 2 Drawing Sheets

DRIVER CIRCUIT, WITH LOW IDLE POWER CONSUMPTION, FOR AN ATTACHMENT UNIT INTERFACE

TECHNICAL FIELD OF INVENTION

The invention relates to a driver circuit, more particularly to a driver circuit for an attachment unit interface (AUI) used in a network system.

BACKGROUND OF THE INVENTION

As shown in FIG. 1, a data terminal equipment (DTE) 11 is connected to a media attachment unit (MAU) 12 through an AUI 13 in IEEE 802.3 Carrier Sense Multiple Access with Collision Detection (CSMA/CD) application. The AUI includes the connector and the transceiver cable for carrying encoded control and data signals between the physical signaling sub-layer of the DTE and the physical medium attachment sub-layer of the MAU and for providing duplex encoded data and control signals transmission. The MAU includes a physical medium attachment (PMA) which, via medium dependent interface (MDI), directly communicates with transmission media (coaxial cable). In PMA, there are hardware circuits with functions of signal transmission, receipt and collision detection. The PMA is also known as transceiver or tap in the technical field. The MAU operates to transmit the encoded data onto the coaxial cable, to receive the data coming through the coaxial cable, and to detect whether more than two DTEs intend to transmit information at the same time. The AUI often functions as a drop cable between the DTE and the transceiver. All signals in transceiver cable are differential which are driven by conventional differential drivers capable of driving a specified 78 Ω cable. A detailed description of the electronic characteristics of the AUI signals may be found in IEEE 802.3 specification.

Conventional differential driver circuits for driving the AUI signals are typically implemented in emitter coupled logic (ECL) circuitry which are complicated and suffers from large power consumption.

U.S. Pat. No. 5,309,036, however, discloses a driver circuit which is implemented in CMOS technology to attain a significantly lower power consumption.

SUMMARY OF THE INVENTION

It is the main objective of the present invention to provide an alternative driver circuit implemented in CMOS technology with lower idle power consumption.

In a first embodiment, the present invention comprises a constant current source, an inverting gate, a pair of NAND gates, a differential transistor pair, a pair of load resistors, a pair of switch transistors, a pair of source followers, and another switch transistor.

The inverting gate receives the enable signal and provides its inverted signal at the output terminal.

One of the pair of NAND gates receives one of the complementary data signals and the inverted signal. Another one of the pair of NAND gates receives another one the complementary data signals and the inverted signal. The pair of the NAND gates output a pair of signals.

The differential transistor pair has a pair of differential transistors. Each of the differential transistors has a drain terminal, a gate terminal which receives one of the output signals of the pair of gates, and a source terminal which is connected to the constant current source.

Each of the switch transistors of the pair has a gate terminal which receives the enable signal, and a drain and source terminals which are connected respectively to a terminal of a respective one of the load resistors and to the drain terminal of a respective one of the differential transistors.

Each of the pair of source followers has a gate terminal connected to a drain terminal of a respective one of the differential transistors, and a source terminal. The source followers receive the differential voltage outputs from the drain terminals of the differential transistors.

The another switch transistor has a gate terminal which receives the enable signal, and source and drain terminals which are respectively connected to the source terminals of the source followers and which are further connected to a respective external pull-down load resistor. The source and drain terminals of the another switch transistor are connected to the attachment unit interface.

In a second embodiment, the present invention comprises a constant current source, a pair of NOR gates, a differential transistor pair, a pair of load resistors, a first pair of switch transistors, a second pair of switch transistors, a pair of source followers and another switch transistor.

One of the pair of NOR gates receives one of the complementary data signals and the enable signal. Another one of the pair of NOR gates receives another one of the complementary data signals and the enable signal. The pair of the NOR gates output a pair of signals.

The differential transistor pair has a pair of differential transistors. Each of the differential transistors has a drain terminal, a gate terminal which receives a respective one of the output signals of the pair of gates, and a source terminal which is connected to the constant current source.

Each pair of load resistors has a first terminal and a second terminal. Each of the switch transistors of the first pair has a gate terminal which receives the enable signal, and drain and source terminals which are connected respectively to a voltage supply and the first terminal of a respective one of the load resistors.

Each of the switch transistors of the second pair has a gate terminal which receives the enable signal, and drain and source terminals which are connected respectively to the second terminal of a respective one of the load resistors and to the respective source terminals of the differential transistors. Each of the switch transistors of the second pair functions selectively to provide a leaking path between the drain terminal of the respective one of the differential transistors and ground.

Each of the pair of source followers has a gate terminal connected to the drain terminal of the respective one of the differential transistors, and a source terminal. The source followers receive the differential voltage outputs from the drain terminals of the differential transistors.

The another switch transistor has a gate terminal which receives the enable signal, and source and drain terminals which are respectively connected to the source terminals of the source followers and which are further connected to a respective external pull-down load resistor. The source and drain terminals of the another switch transistor are connected to the attachment unit interface.

BRIEF DESCRIPTION OF THE DRAWINGS

Other features and advantages of the present invention will become apparent in the following detailed description of the preferred embodiment with reference to the accompanying drawings of which.

DETAILED DESCRIPTION OF THE PREFERRED EMBODIMENT

Figure 1:
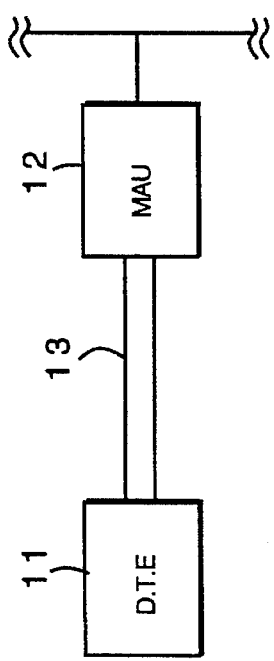
FIG. 1 illustrates the use of an AUI to interconnect DTE and a MAU in accordance with IEEE 802.3 CSMA/CD specification.
Figure 2:
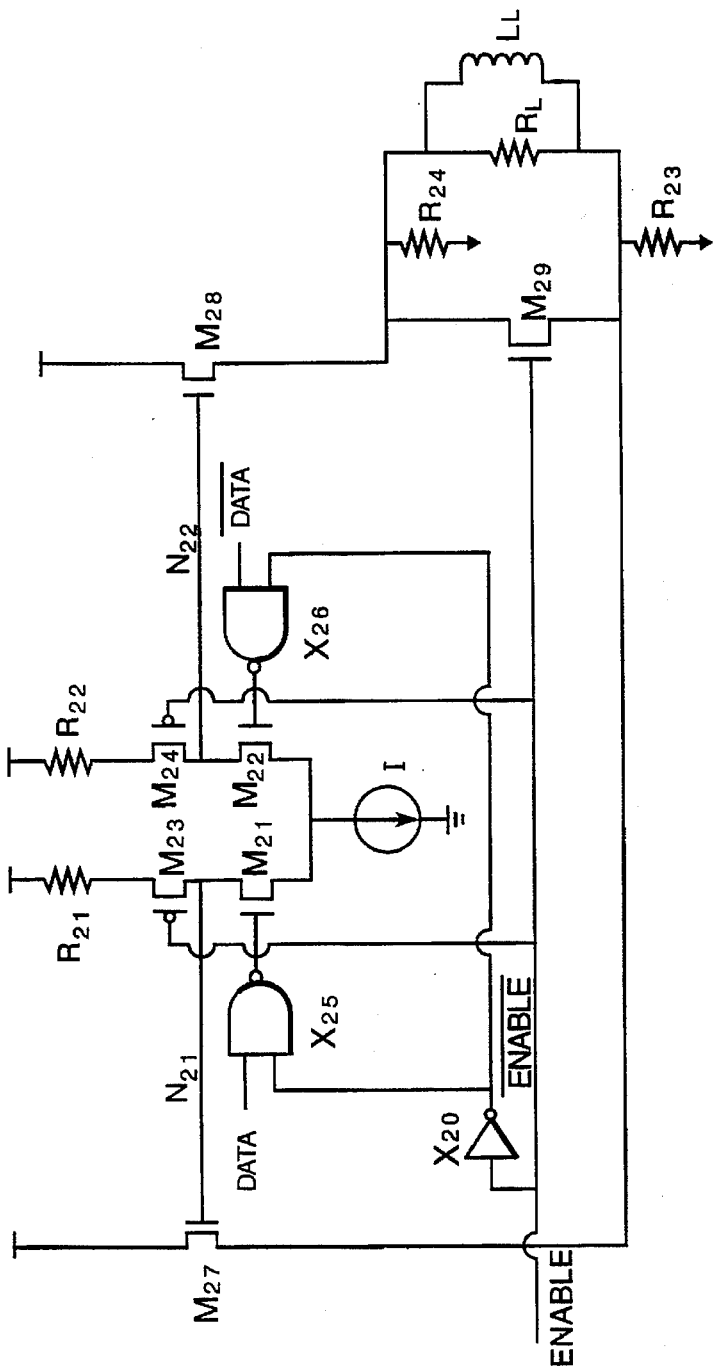
FIG. 2 is a schematic electronic circuit of a preferred embodiment.

Referring to the first embodiment of the invention shown in FIG. 2, the driver circuit comprises a constant current source I, an inverting gate X20, a pair of NAND gates (X25, X26), a differential transistor pair (M21, M22), a pair of load resistors (R21, R22), a pair of switch transistors (M23, M24), a pair of source followers (M27, M28), and a switch transistor M29.

The inverting gate X20 receives the enable signal and provides its inverting signal at the output terminal.

One of the pair of NAND gates (X25, X26) receives one of the complementary data signals (DATA, –DATA) and the inverted signal –ENABLE. Another one of the pair of NAND gates (X25, X26) receives another one the complementary data signals (DATA, –DATA) and the inverted signal –ENABLE. The pair of the NAND gates (X25, X26) output a pair of signals.

The differential transistor pair has a pair of differential transistors (M21, M22). Each of the differential transistors has a drain terminal, a gate terminal which receives a respective one of the output signals of the pair of NAND gates (X25, X26), and a source terminal which is connected to constant current source I.

Each of the switch transistors of the pair (M23, M24) has a gate terminal which receives the enable signal, and drain and source terminals which are connected respectively to a terminal of a respective one of the load resistors (R21, R22) and to the drain terminal of a respective one of the differential transistors (M21, M22).

Each of the pair of source followers (M27, M28) has a gate terminal connected to the drain terminal of the respective one of the differential transistors (M21, M22), and a source terminal. The source followers (M27, M28) receive the differential voltage output from the drain terminals of the differential transistors (M21, M22).

The switch transistor M29 has a gate terminal which receives the enable signal, and source and drain terminals which are respectively connected to the source terminals of the source followers (M27, M28) and which are further connected to a respective external pull-down load resistor (R23 or R24). The source and drain terminals of the switch transistor M29 are connected to the attachment unit interface, represented by RL and LL.

Normal Operation of Circuit in FIG. 2 a. Enable signal drives logic low signal for X20, M23, M24 and M29.

b. Inverter X20 drives logic high signal for X25 and X26 and, therefore, X25 and X26 pass the differential data signal (DATA, –DATA) to the inputs of the differential amplifier (M21, M22).

c. M23 and M24 are turned on with low channel resistance so as to ensure the gain of the differential amplifier (M21, M22) is not affected.

d. M29 is shut off to exhibit a high impedance to source followers (M27, M28) which are able to drive differential signals to a heavy inductive load.

e. The differential signal outputs, N21 and N22, of the differential amplifier (M21, M22) are buffered by the source follower stage so as to produce wave form conformed to AUI signal specification described in IEEE 802.3.

f. The driver circuit is fully symmetric so as to produce a fully balanced differential AUI signal wave form.

Operation of Start of Idle of Circuit in FIG. 2 a. Enable signal drives logic high signal for X20, M23, M24 and M29.

b. Inverter X20 drives logic low signal for X25 and X26. Therefore, X25 and X26 block the differential data signal and drive logic high signals to the inputs of the differential amplifier (M21, M22).

c. M23 and M24 are turned off and, therefore, R21 and R22 are isolated from the differential amplifier (M21, M22). Therefore, the bias current, i.e. 4 mA, can be saved during Idle of circuit.

d. Under conditions b and c above, M21 and M22 provide discharge (leaking) paths for excess charges at the drain terminals of differential transistors (M21, M22).

e. While the discharging is in progress in condition of d., M29 is turned on to exhibit a very low impedance so as to clamp the differential outputs of the source followers (M27, M28) and limit the undershoot to 100 mv.

Figure 3:
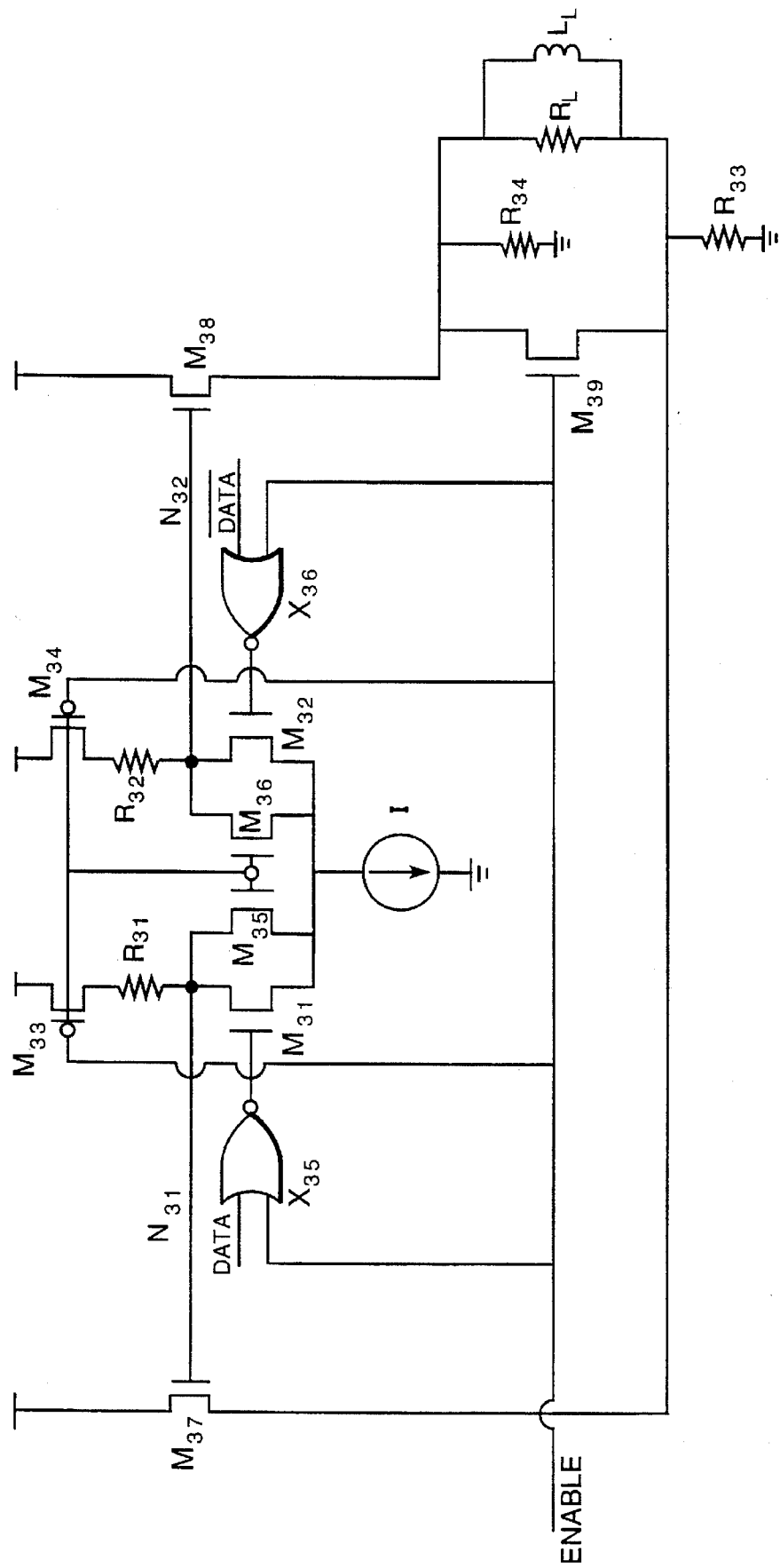
FIG. 3 is a schematic electronic circuit of another preferred embodiment.

Referring to the second embodiment of the invention shown in FIG. 3, the driver circuit comprises a constant current source I, a pair of NOR gates (X35, X36), a differential transistor pair (M31, M32), a pair of load resistors (R31, R32), a first pair of switch transistors (M33, M34), a second pair of switch transistors (M35, M36), a pair of source followers (M37, M38) and a switch transistor M39.

One of the pair of NOR gates (X35, X36) receives one of the complementary data signals (DATA, –DATA) and the ENABLE signal. Another one of the pair of NOR gates (X35, X36) receives another one of the complementary data signals (DATA, –DATA) and the ENABLE signal. The pair of NOR gates (X35, X36) outputs a pair of signals.

The differential transistor pair has a pair of differential transistors (M31, M32). Each of the differential transistors (M31, M32) has a drain terminal, a gate terminal which receives a respective one of the output signals of the pair of NOR gates (X35, X36), and a source terminal which is connected to constant current source I.

Each of load resistors (R31, R32) has a first terminal and a second terminal. Each of the switch transistors of the first pair (M33, M34) has a gate terminal which receives the enable signal, and a drain and source terminals which are connected respectively to a voltage supply and the first terminal of a respective one of the load resistors (R31, R32).

Each of the switch transistors of the second pair (M35, M36) has a gate terminal which receives the enable signal, and drain and source terminals which are connected respectively to the second terminal of the respective one of the load resistors (R31, R32) and to the source terminal of the respective one of the differential transistors (M31, M32). Each of the switch transistors of the second pair (M35, M36) functions selectively to provide a leaking path between the drain terminals of the differential transistor (M31, M32) and ground.

Each of the pair of source followers (M37, M38) has a Bate terminal connected to the drain terminal of the respective one of the differential transistors (M31, M32), and a source terminal. The source followers (M37, M38) receive the differential voltage outputs (N31, N32) from the drain terminals of the differential transistor (M31, M32).

The switch transistor M39 has a gate terminal which receives the enable signal, and a source and drain terminals which are connected to the source terminal of a respective one of the source followers (M37, M38) and which are further connected to a respective external pull-down load resistor (R34 or R33). The source and drain terminals of the switch transistor M39 are connected to the attachment unit interface, represented by RL and LL.

Normal Operation of Circuit in FIG. 3 a. Enable signal drives logic low signals for X35, X36, M33, M34, M35, M36 and M39.

b. X35 and X36 pass the differential data signals (DATA, –DATA) to the inputs of the differential amplifier (M31, M32).

c. M33 and M34 are turned on with low channel resistance so as to ensure the gain of the differential amplifier (M31, M32) is not affected.

d. M35 and M36 are shut off and do not affect the normal operation of the differential amplifier (M31, M32).

e. M39 is shut off to exhibit a high impedance to source followers (M37, M38) which are able to drive differential signals to a heavy inductive load.

f. The differential signal outputs, N31 and N32, of the differential amplifier (M31, M32) are buffered by the source follower stage so as to produce wave form conformed to AUI signal specification described in IEEE 802.3.

g. The driver circuit is fully symmetric so as to produce a fully balanced differential AUI signal wave form.

Operation of Start of Idle of Circuit in FIG. 3 a. Enable signal drives logic high signal for X35, X36, M33, M34, M35, M36 and M39.

b. X35 and X36 block the differential data signals and drive logic low signals to the inputs of the differential amplifier (M31, M32) so as to shut off M31 and M32.

c. M33 and M34 are turned off and, therefore, power voltage Vdd is isolated from the differential amplifier (M31, M32). Therefore, the bias current, i.e. 4 mA, can be saved during Idle of circuit.

d. M35 and M36 provide discharge (leaking) paths for excess charges at the drain terminals of the differential transistors (M31, M32) in the conditions of b and c above.

e. While the discharging is in progress in condition of d., M39 is turned on to exhibit a very low impedance so as to clamp the differential outputs of the source followers (M37, M38) and limit the undershoot to 100 mv.

What is claimed is:

1. A driver circuit for an attachment unit interface used in a network system, the network system providing complementary data signals and an enable signal to the driver circuit, the driver circuit comprising:

a constant current source;

a gate for outputing an inverted signal of the enable signal;

a pair of gates for outputing a pair of signals by NANDing its input signals, one of the gates of the pair of gates receiving one of the complementary data signals and the inverted signal, and another one of the gates of the pair of gates receiving another one of the complementary data signals and the inverted signal;

a differential transistor pair having a pair of differential transistors, each of the differential transistors having a drain terminal, a gate terminal which receives a respective one of said output signals of the pair of gates, and a source terminal which is connected to said constant current source;

a pair of load resistors;

a pair of switch transistors, each of the switch transistors of the pair having a gate terminal which receives the enable signal, and a drain and source terminals which are connected respectively to a terminal of a respective one of the load resistors and to the drain terminal of a respective one of the differential transistors;

a pair of source followers, each having a gate terminal connected to the drain terminal of the respective one of the differential transistors, and a source terminal, said source followers receiving said differential voltage outputs from the drain terminals of the differential transistors; and another switch transistor having a gate terminal which receives said enable signal, and source and drain terminals which are respectively connected to said source terminals of said source followers and which are further connected to a respective external pull-down load resistor, said source and drain terminals of said another switch transistor are connected to the attachment unit interface;

wherein bias current which operates the differential transistor pair is saved during Idle of the circuit by a de-assertion state of the enable signal.

2. The driver circuit as claimed in claim 1, wherein all of said differential transistors, said source followers and said switch transistors are CMOS transistors.

3. A driver circuit for an attachment unit interface used in a network system, the network system providing complementary data signals and an enable signal to the driver circuit, the driver circuit comprising:

a constant current source;

a pair of gates for outputing a pair of signals by NORing its input signals, one of the gates receiving one of the complementary data signals and the enable signal, and another one of the gates receiving another of the complementary data signals and the enable signal;

a differential transistor pair having a pair of differential transistors, each of the differential transistors having a drain terminal, a gate terminal which receives a respective one of said output signals of the pair of gates, and a source terminal which is connected to said constant current source;

a pair of load resistors, each of the load resistors having a first terminal and a second terminal;

a first pair of switch transistors, each of the switch transistors of the first pair having a gate terminal which receives the enable signal, and a drain and source terminals which are connected respectively to a voltage supply and the first terminal of a respective one of the load resistors;

a second pair of switch transistors, each of the switch transistors of the second pair having a gate terminal which receives the enable signal, and a drain and source terminals which are connected respectively to the second terminal of the respective one of the load resistors and to the source terminal of the respective one of the differential transistors, for selectively providing a leaking path between the drain terminal of the respective one of the differential transistors and ground;

a pair of source followers, each having a gate terminal connected to the drain terminal of the respective one of the differential transistors, and a source terminal, said source followers receiving differential voltage outputs from the drain terminals of the differential transistors; and another switch transistor having a gate terminal which receives said enable signal, and source and drain terminals which are respectively connected to said source terminals of said source followers and which are further connected to a respective external pull-down load resistor, said source and drain terminals of said another switch transistor are connected to the attachment unit interface;

wherein bias current which operates the differential transistor pair is saved during Idle of the circuit by a de-assertion state of the enable signal.

4. The driver circuit as claimed in claim 3, wherein all of said differential transistors, said source followers and said switch transistors are CMOS transistors.

* * * * *